(12) United States Patent
Jeng et al.

(10) Patent No.: US 6,328,815 B1
(45) Date of Patent: Dec. 11, 2001

(54) MULTIPLE CHAMBER VACUUM PROCESSING SYSTEM CONFIGURATION FOR IMPROVING THE STABILITY OF MARK SHIELDING PROCESS

(75) Inventors: Shwangming Jeng, Hsin-Chu; Chen-Fang Chung, Shinchu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/253,292

(22) Filed: Feb. 19, 1999

(51) Int. Cl.$^7$ ................... B08B 1/02; B08B 7/00
(52) U.S. Cl. ............... 134/32; 134/26; 134/902; 134/18; 438/908
(58) Field of Search ............... 134/26, 32, 902, 134/18; 438/906, 908; 29/25.01

(56) References Cited

U.S. PATENT DOCUMENTS

| | | | |
|---|---|---|---|
| 4,951,601 | 8/1990 | Maydan et al. | 118/719 |
| 5,292,393 | 3/1994 | Maydan et al. | 156/345 |
| 5,505,779 | 4/1996 | Mizuno et al. | 118/719 |
| 5,516,732 | * 5/1996 | Flegal | 437/250 |
| 5,928,389 | * 7/1999 | Jevtic | 29/25.01 |
| 6,074,443 | * 6/2000 | Venkatesh et al. | 29/25.01 |

* cited by examiner

*Primary Examiner*—Alexander Markoff
(74) *Attorney, Agent, or Firm*—George O. Saile; Stephen B. Ackerman (57) ABSTRACT

A new configuration of a basic concatenatable integrated modular multiple chamber vacuum processing system for wafer manufacturing vacuum processes is disclosed. The basic system includes at least one multiple ported transfer vacuum chamber, an R-θ transfer means contained within each chamber, a multiplicity of ports adaptable for appending a variety of vacuum process chambers as well as forming entrance/exit ports with at least one dual port pass through chamber attached to one entrance/exit port. Each pass through chamber contains a wafer alignment and/or orientation means for aligning or orienting the wafer as necessary in any of the appended process chambers. The configuration minimizes alignment or orientation errors due to inherent instability of the concatenated transfer means operations.

4 Claims, 9 Drawing Sheets

MULTIPLE CHAMBER VACUUM PROCESSING SYSTEM CONFIGURATION FOR IMPROVING THE STABILITY OF MARK SHIELDING PROCESS

BACKGROUND OF THE INVENTION (1) Field of the Invention

The invention relates to the fabrication of integrated circuit devices, and more particularly to a new configuration of a multiple chamber vacuum processing system (MCVPS) for the purpose of improving the positional stability of the wafer mark shielding process, (2) Description of the Prior Art The prior art of semiconductor processing including plasma etching, CVD deposition, physical sputtering, etc. has progressed from single vacuum chamber batch-type systems performing a single processing operation upon a plurality of small diameter single part-numbered wafers made of semiconductor material which typically were manually or semi-automatically loaded into the process chamber for the purpose of high throughput.

Since that time, semiconductor circuit design requirements, manufacturing economics and necessary higher product yields have driven the industry to develop and utilize manufacturing equipment to operate on relatively fewer but much larger wafers possibly containing a multiple of part numbers with finer geometry and dimensions but requiring precise automatic material handling. Such yield enhancement and flexibility needs demanded a higher level of automated in-situ integrated processing.

Manufacturing subsystems which are capable of doing a multiple of processes upon larger wafers in-situ became available in the mid 1980s.

U.S. Pat. No. 4,951,601 (Maydan et al., 1990) discloses an integrated modular multiple chamber vacuum processing system (IMMCVPS) which is capable of integrating a variety of types of integrated circuit processes such as deposition, sputtering, etching and annealing. It includes a robotics R-$\theta$ transfer means to move a wafer to and from external and internal wafer cartridge loading elevators as well as to and from single axis robotics mechanisms within each of the multiply appended process chambers.

U.S. Pat. No. 5,505,779 (Mizuno et al., 1996) illustrates in a context figure another of the prior art integrated module multi-chamber processing systems. Generic to this illustration is an R-$\theta$ transfer means within a single vacuum transfer chamber with six process chambers attached.

U.S. Pat. No. 5,292,393 (Maydan et al., 1994) further discloses the details of the R-$\theta$ robotics transfer system and its operation together with those of selected individual chamber cooperating single axis transfer means. More importantly, it illustrates how a plurality of such transfer chambers, utilizing only one external wafer cartridge, can be concatenated to provide a more complex system to handle additional serial or parallel processing operations. Although precision of the R-$\theta$ transfer movements is controlled by the rotation of concentric drive shafts, there is no teaching about maintaining the precise location, alignment or orientation of the wafer as it is transferred between the multitude of process steps, especially when the process steps require using concatenated transfer chambers.

SUMMARY OF THE INVENTION

The principal object of the present invention is to define a configuration of a multiply concatenated integrated modular multiple chamber vacuum processing system (IMMCVPS) that requires wafer alignment or orientation of the wafer as required in the appended process chambers.

A second objective of the present invention is to utilize the above mentioned configuration in a method that will minimize the positional error of a wafer within a process chamber.

It is a further object of the present invention to define a configuration of integrated modular multiple chamber vacuum processing systems (IMMCVPS) with the above advantages which does not affect the maximum processing capability of such a system when it includes the necessary alignment or orientation means.

It is another object of the present invention to define a configuration of a monolithically connected set of integrated modular multiple chamber vacuum processing systems (IMMCVPS) having the above advantages.

When in the process of deposition of material, such as aluminum-copper (Al:Cu) or titanium nitride (TiN) upon a wafer, it is necessary to prevent the deposition of the same on certain areas. These areas are well defined and contain marks necessary for subsequent manufacturing operations as well as to meet alignment needs of the present invention. Shadow masks and other devices must be precisely aligned with the object wafer during this deposition process. These devices are fixed within each of the required process chambers and therefore it is the wafer that must be properly aligned or oriented with these masks to afford the proper protection to the mark area. Generally, there is no major alignment or orientation operation within the process chamber due to process chamber design limitations, expense or complexity and therefore this must be accomplished once or repeatedly at a former step in the overall multiple chamber operation.

The required alignment operation may include a complex lateral X, Y translation movement as well as a $\theta$ rotation of the wafer with respect to a datum. Although the present invention involves only an $\theta$ axis orientation and utilizes an orientor, it is to be understood that the present invention can include the use of more complex alignment means.

Desirably, an alignment step which prealigns a wafer to a datum may be done once for all subsequent operations. However, the transfer means, such as the above R-$\theta$ device, is limited in precision and accuracy and multiple transfers with such devices to and from the attending multiple processes incur a build up of alignment errors which are beyond the tolerance required within specific processes such as the alignment to the shadow masks. In the equipment of the present invention, the robotics transfer means is responsible for approximately +/−0.5 mm of error for each transfer and of course for three such transfers can cause as much as +/−1.5 mm alignment error of the wafer in a process chamber.

Therefore it is advantageous to define optimum locations and operation steps for alignment or orientation means within concatenated IMMCVPS configurations where alignment or orientation operations can be performed to minimize the alignment errors while minimizing the other factors adversely affecting the IMMCVPS.

DESCRIPTION OF THE DRAWINGS

In the accompanying drawings forming a material part of this description, there is shown.

Figure 1:
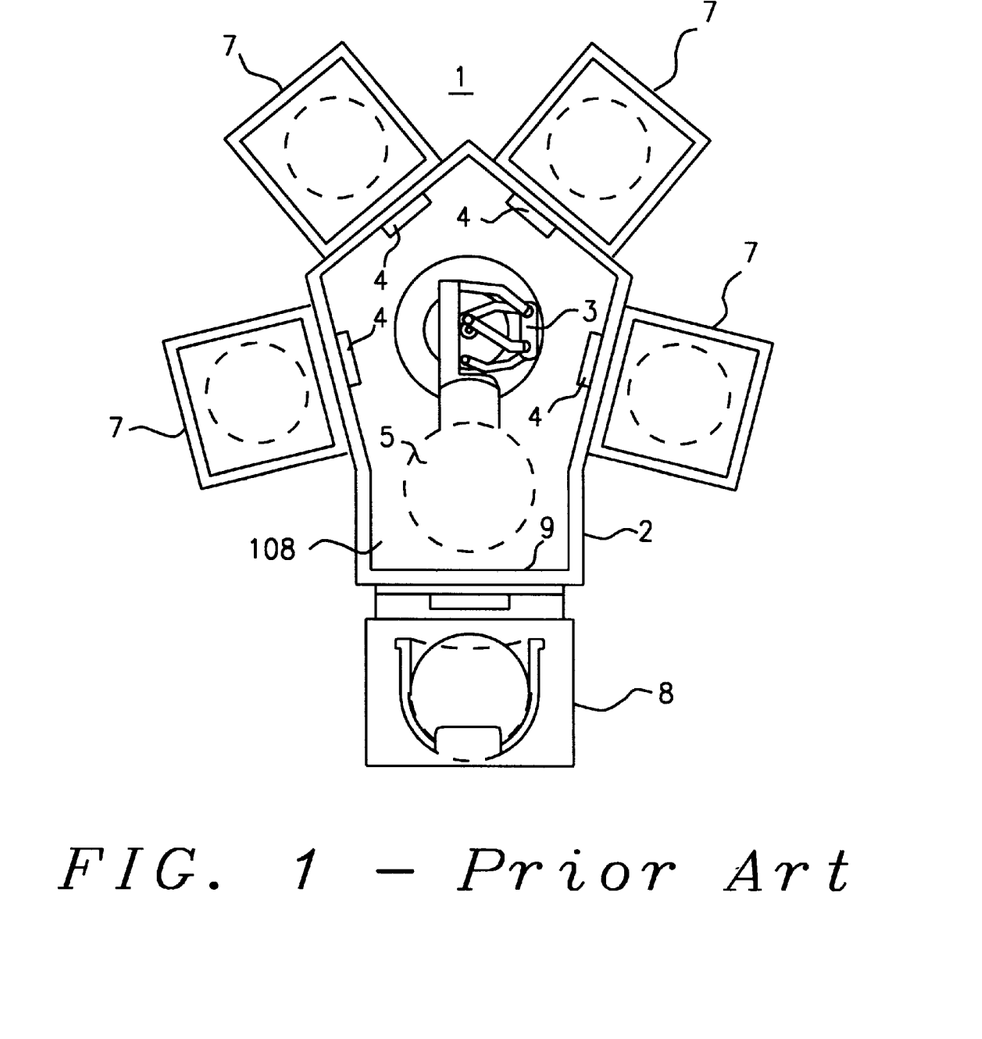
FIG. 1 is a simplified top plan view of a prior art single transfer integrated modular multiple chamber processing system (IMMCVPS), cross sectioned to illustrate the location of the transfer chamber, the external load/unload means and the multiple appended process chambers.

FIG. 1 is illustrative of a typical prior art single transfer integrated modular multiple chamber vacuum processing system (IMMCVPS) 1. Basic to this apparatus is a single transfer chamber 2 containing a single transfer means 3 and having a plurality of ports 4, through which a wafer 5 can be transferred by the transfer means 3. The transfer means depicted here is a typical R-θ device where θ movements select the ports and the wafer is radially moved through the selected port. Appended to the walls of the transfer chamber 2 at some or all of the ports 4 are a multiple (4 shown) of process chambers 7 in which processes such as plasma etching, chemical vapor deposition, physical sputtering and annealing are performed in a vacuum environment. The vacuum environment is maintained for the wafer by a load lock system which supports the modularity of the system. Typically a storage cassette 8 is externally located at a closable entrance port 9 as a source and receptacle for wafers being processed. In one version of the prior art, an additional storage cassette 108 is located internal to the transfer chamber 2 adjacent to the entrance port 9 to reduce multiple vacuum pump down cycles.

Relative to the present invention, should the operation of any of these four process chambers require a fine alignment step, then either the internal storage cassette or one of the process chambers 7 would have to be eliminated and be replaced with an alignment device thereby reducing throughput capacity.

Figure 2:
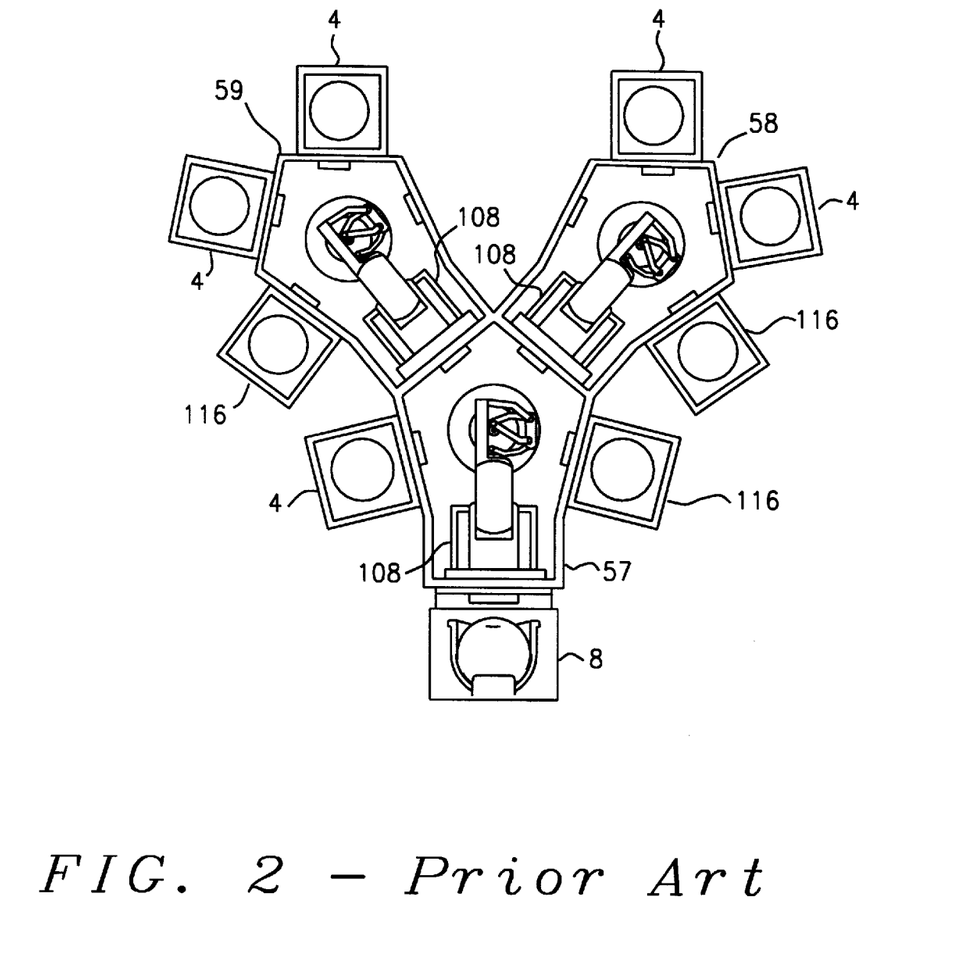
FIG. 2 is another simplified top plan view of the prior art which illustrates the concatenation of several single transfer multiple chamber integrated processing systems.

Prior art FIG. 2, illustrates the concatenation of several identical prior art single transfer integrated modular multiple chamber vacuum processing systems (IMMCVPS) 1. It can be noted that such arrangements not only are advantageous as mentioned above but also they can disadvantageously replicate the problems of reduced throughput capacity if any of the concatenated process chambers require proximate alignment. But a worst case of such a concatenation, requiring internal storage 108 and alignment operations 116 associated with each transfer chamber, would diminish the number of usable process chambers 4 from a maximum of eight to only five resulting in a 37% reduction in throughput. It could be further demonstrated that for another concatenation of two more identical transfer s with similar alignment and storage requirements, that the available process chamber 4 locations would decrease from a maximum of fourteen to only seven, a resulting 50% reduction in throughput. Clearly, proper organization of the locations of multiple storage and alignment means is critical to manufacturing throughput, cost, complexity and reliability.

Figure 3A:
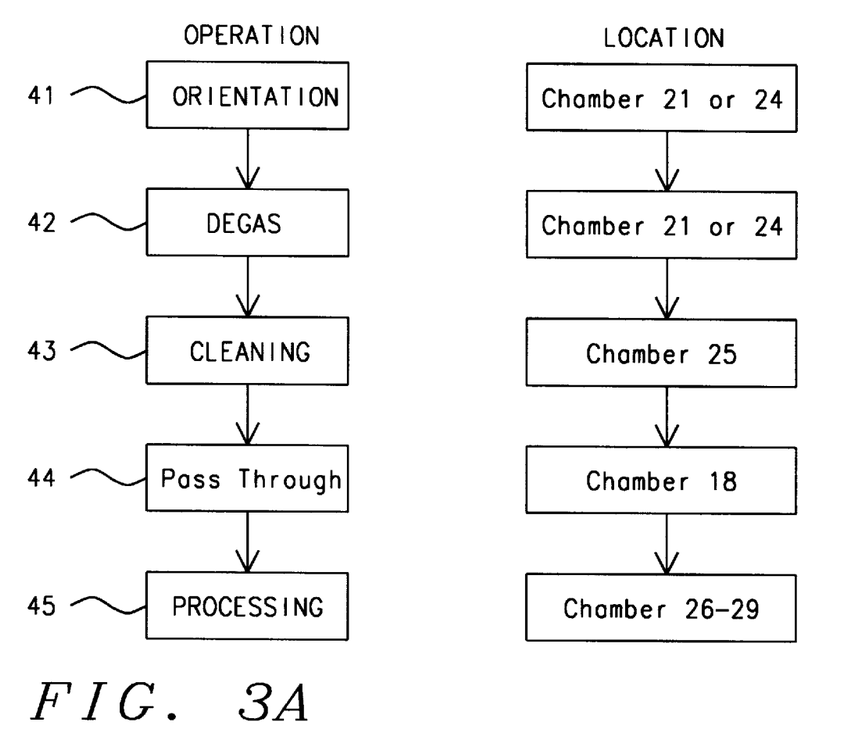
FIG. 3A is a truncated flowchart listing the original method of processing with the system shown in FIG. 3B together with the associated locations of the semiconductor wafer.
Figure 3B:
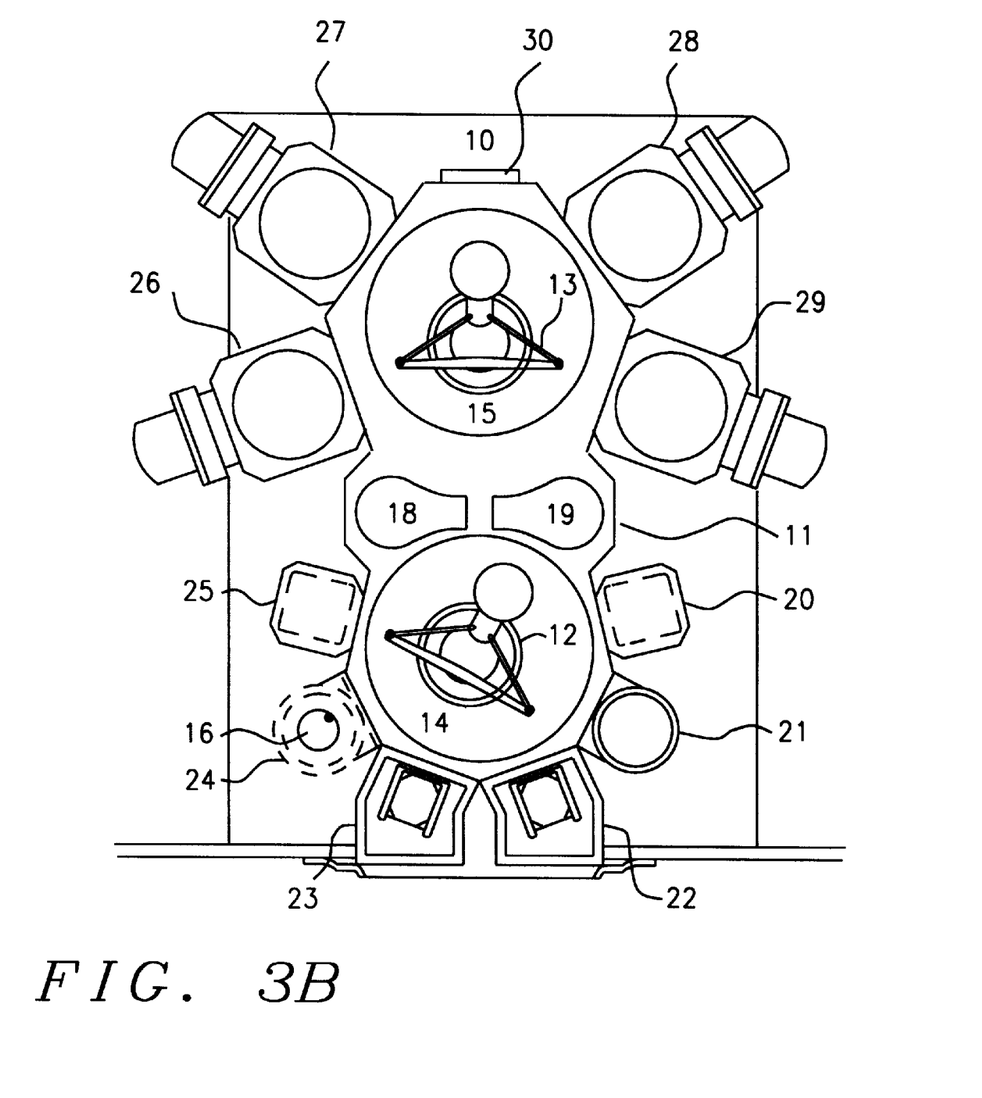
FIG. 3B is a simplified top plan view of a monolithic dual transfer means integrated modular multiple chamber vacuum processing system (IMMCVPS), illustrating the original location of the a wafer orientor in a chamber when required for operation of the system.

Shown in FIG. 3B is another type of integrated modular multiple chamber vacuum processing system (IMMCVPS) 10 that is used context of the present invention. It is a dual transfer chamber version as it contains within a monolithic vacuum casing 11, two transfer means 12 and 13 respectively housed in a first transfer chamber 14 and a second transfer chamber 15. The first transfer chamber is alternatively known as the buffer chamber wherein operations prepare the wafer for the process chambers in the second transfer chamber. Within the monolithic casing 11, the first transfer chamber 14 and the second transfer chamber 15 are separated by two smaller chambers, pass through chamber 18 and chamber B19. The first transfer chamber 14 and the second transfer chamber 15 communicate through either or both pass through chamber 18 or chamber B 19 and in this way a desired vacuum level is maintained in the four respective chambers.

In addition to pass through chamber 18 and chamber B 19, the first transfer chamber 14 is surrounded by six additional ported chambers. In clockwise order, the six ported chambers are chamber D 20, chamber F 21, wafer load/unload B chamber 22, wafer load/unload A chamber 23, chamber E 24 and chamber C 25. Likewise, in addition to pass through chamber 18 and chamber B 19, the second transfer chamber 15 is surrounded by four process chambers 26, 27, 28 and 29 in a clockwise manner. Between process chambers 27 and 28 there is a spare additional closed port 30 available to accept another process chamber.

In a truncated version of an original operation, as flowcharted in FIG. 3A, a wafer stored in the load/unload chambers 22 or 23 is accessed by the transfer means 12 and transferred to chamber E 24 or chamber F 21. In chambers 24 or 21 a degas operation 42 is performed on the wafer. In this original configuration, an orienting step 41 is performed, relative to a notch in the periphery of the wafer and a datum, by an orientor 16 located in chamber 24 to orient the wafer. Once oriented and degassed the wafer is removed from chambers E 24 or F 21 by the transfer means 12 and placed into chamber C 25 where a wafer cleaning operation 43 takes place. After the wafer is cleaned, the transfer means 12 removes the wafer from chamber C 25. In a pass through operation 44 the wafer is passed through pass through chamber 18 as the result of sequential actions of transfer means 12 in first transfer chamber 14 and transfer means 13 in first second transfer 15. Once in the second transfer chamber 15, the wafer is routed to the appropriate process chamber 26, 27, 28 and 29 for the remaining process operation 45, herein the deposition of aluminum-copper (Al:Cu) and titanium nitride (TiN) on the surface of the wafer.

The wafer that completes all the processing steps is transferred by the transfer means 13 into chamber B 19 where it resides until it is appropriately cooled. Transfer means 12 subsequently transfers the wafer from chamber B 19 to the load/unload chamber 22 or 23 where the processed wafer will be stored. Wafers in the load/unload chamber 22 or 23 are then accessed by the operator.

The positional error of the robotics transfer means is about +/-0.5 mm per transfer. In this original sequence of transfers from the orientor 16 located in chamber E 24, through the cleaning operation in chamber C 25, and through the pass through chamber 18 to the first of the process chambers 26–29, three robotics motions occur leading to as much as +/-1.5 mm of wafer positional error in the process chamber.

DESCRIPTION OF THE PREFERRED EMBODIMENTS

Figure 4A:
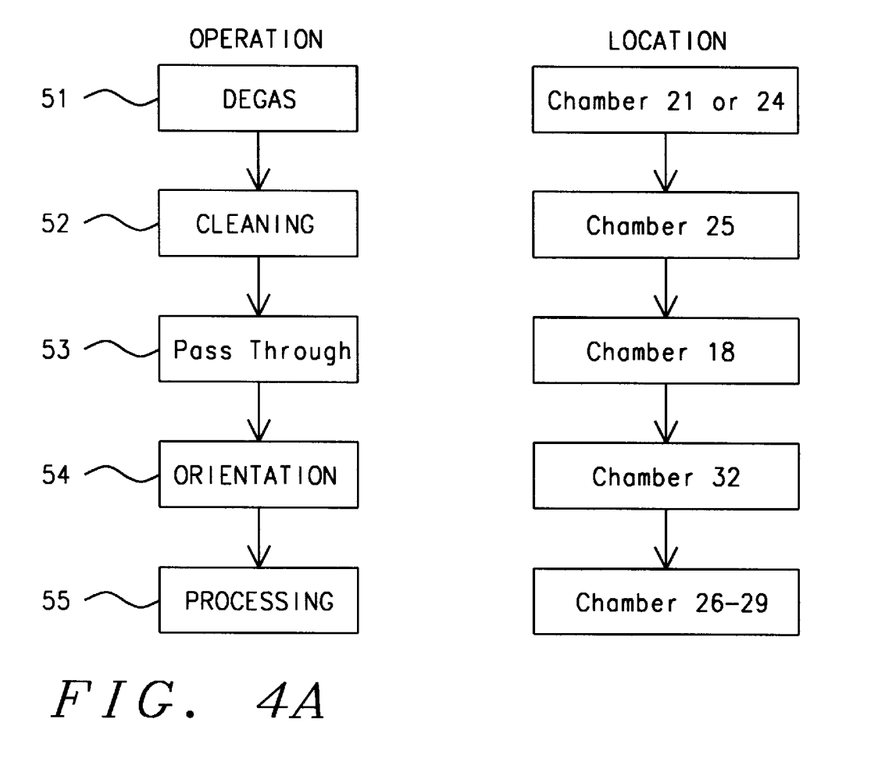
FIG. 4A is a truncated flowchart listing the new method of processing with the system shown in FIG. 4B together with the associated locations of the semiconductor wafer.
Figure 4B:
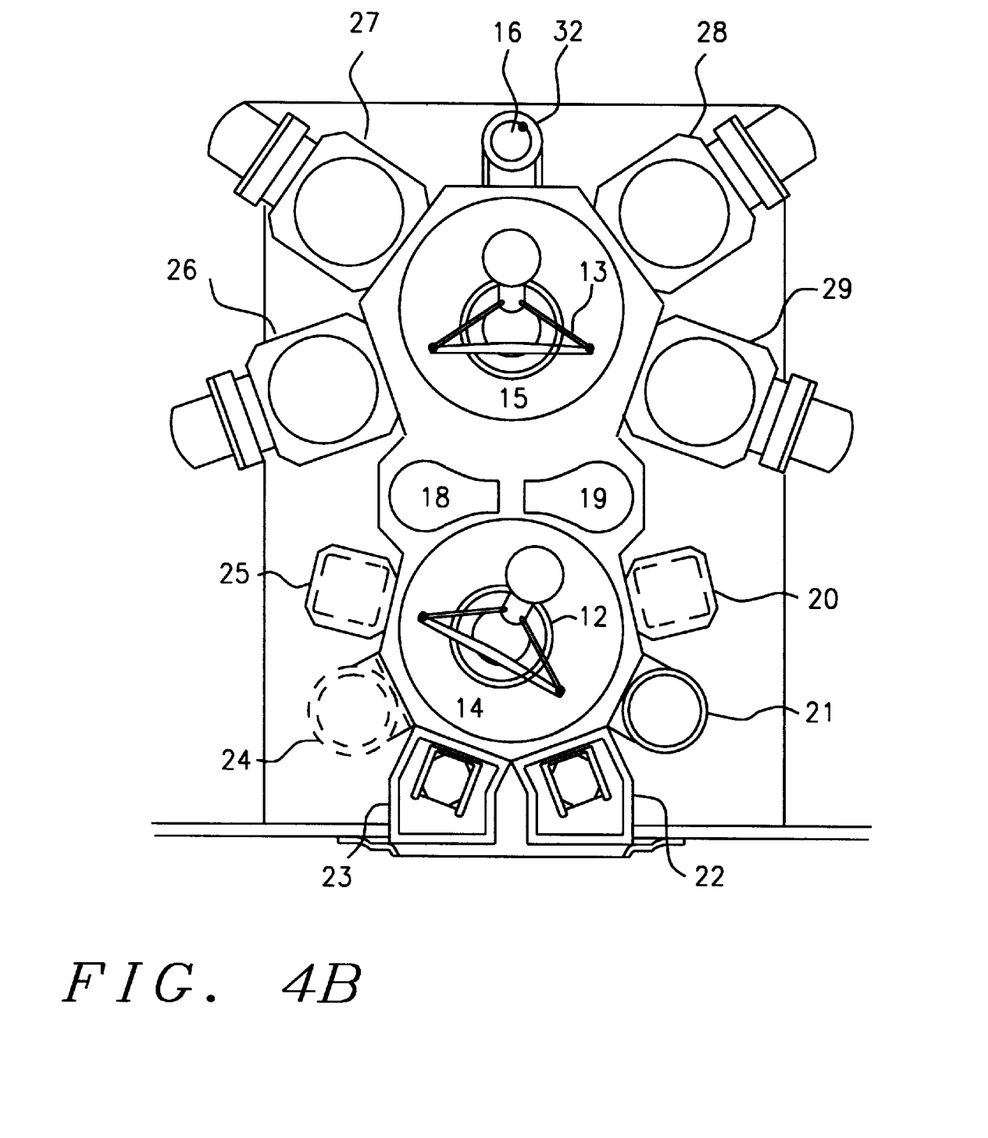
FIG. 4B is a simplified top plan view of the same monolithic dual transfer means integrated modular multiple chamber processing system (IMMCVPS), illustrating the improved location for the wafer orientor in another chamber as required for operation of the system.

FIGS. 4B and 4A depict one of the new configurations of the integrated modular multiple chamber vacuum processing system (IMMCVPS) and its new process sequence. Basically, the orientor has been relocated to a place advantageous to limiting the build up of transfer errors. In this first embodiment, the orientor 16 is mounted in an alignment chamber 32 which is appended to the second transfer chamber 15 and is disposed equidistant between process chambers 27 and 28, and similarly between process chambers 26 and 29. In this configuration, there need only be one transfer movement between the orientor 16 and any one of the process chambers 26–29. Because of the equidistant placement of the orientor 24 to each of the process chambers 26–29, distance related error build up should be minimized for this single transfer movement.

The new process sequence as found in FIG. 4A requires the wafer to move from the load/unload chamber 22 or 23 to the degas chambers 21 or 24 via transfer means 12. Following the degas operation 51, the wafer is further transferred to the cleaning chamber C 25 for the cleaning operation 52. After cleaning, the transfer means 12 transfers the wafer to the pass through chamber 18 where it is accessed by transfer means 13, completing the pass through operation 53 and transferred to the orientor 16 located in alignment chamber 32 for orientation. After orientation step 54, the wafer is again transferred by the transfer means 13 to the process chambers 26–29. Return of the processed wafer to the load/unload chambers 22 or 23 is accomplished in a manner similar to that done in the above mentioned original configuration.

Figure 5A:
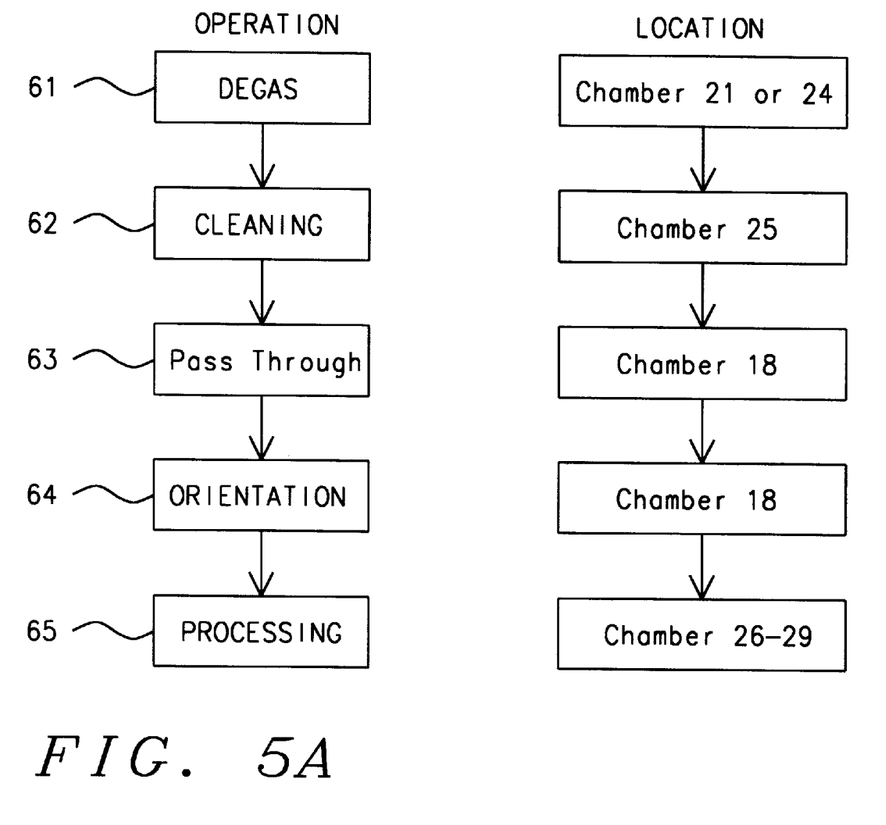
FIG. 5A is a truncated flowchart listing the new method of processing with the system shown in FIG. 5B together with the associated locations of the semiconductor wafer.
Figure 5B:
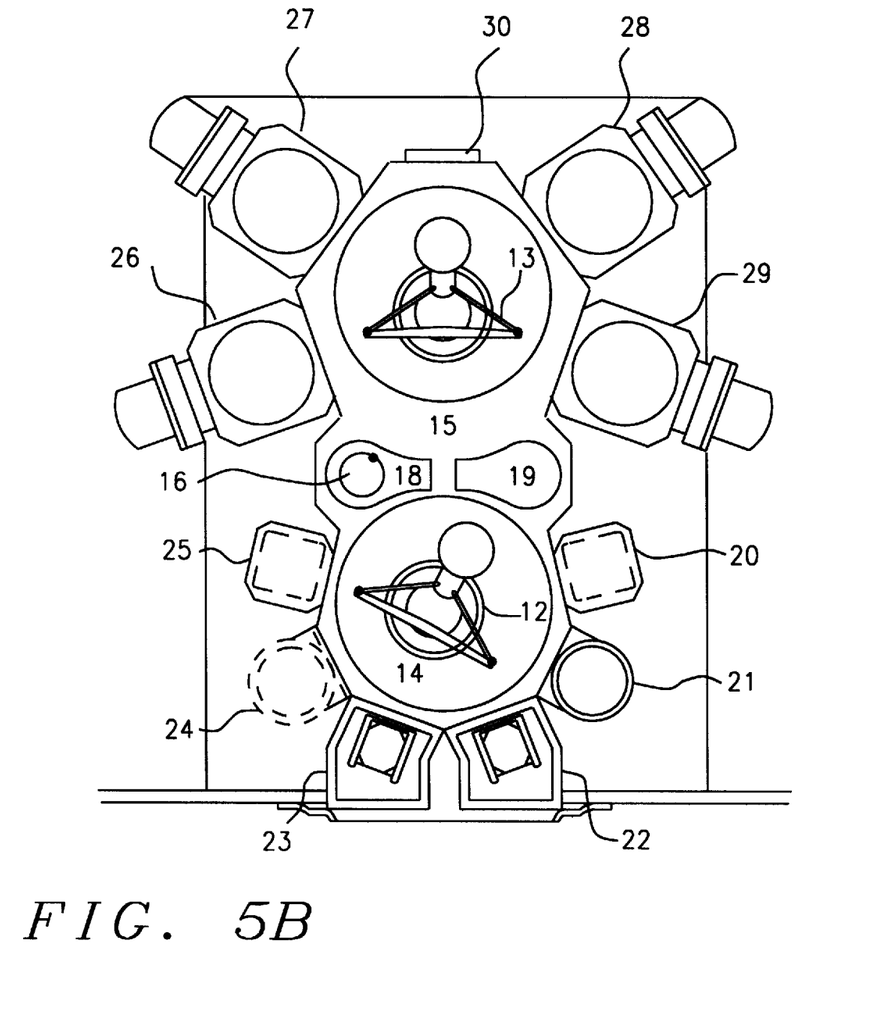
FIG. 5B is a simplified top plan view of the same monolithic dual transfer integrated modular multiple chamber processing system (IMMCVPS), illustrating an alternate improved location of the wafer orientor chamber as required for operation of the system.

Refer to FIG. 5B. In the second embodiment the orientor 16 is mounted in the pass through chamber 18. Since the pass through chamber 18 is accessible by transfer means 13 directly, there would be only one transfer movement from the orientor 16 to any of the process chambers 26–29. Though this arrangement may not limit any possible small θ distance error buildups as in the first embodiment, it does allow for the spare chamber location 30 to be utilized for future system enhancements.

The sequence steps for this second embodiment is found in FIG. 5A. As in the above mentioned first embodiment, the wafer is transfer from the load/unload chambers 22 or 23 to the degas operation 61 at chambers 24 or 21, thence to the cleaning operation 62 in chamber C 25, thence for the pass though operation 63 at the pass through chamber 18. However, in this second embodiment, the wafer in the pass through chamber 18 is then subjected to an orientation operation 64 by the orientor 16. When orientation is complete the wafer is transferred to the appropriate process chamber 26–29 for the processing operation 65. There is only one transfer movement between wafer orientation and the subject process operation. Return of the wafer is made in the same manner as in the original and first embodiment configurations, namely via chamber B 19 to the load/unload chamber 22 or 23.

In the above descriptions, the redundancy of use of some of the chambers of the system is not discussed, but it will be understood that the load/unload chambers 22 and 23 can operate as input or output or both, that the degas operation can be optional in chamber F 21 as well as chamber E 24, that chamber D 20 could serve as a second cleaning station, and so forth for other combinations of the elemental chambers found in FIGS. 3B, 4B and 5B.

While both the first and second embodiments relate to a monolithic casing dual transfer vacuum chamber structures and the second embodiment relates to the utilization of the third internal chamber, chamber 18, a third embodiment of the present invention utilizing a non-monolithic casing vacuum chamber system in a new concatenating manner is presented.

Refer back to FIGS. 1 and 2 to review how the prior art integrated modular multiple chamber vacuum processing system (IMMCVPS) are concatenated. Two additional identical IMMCVPSs 58 and 59 devoid of their external wafer load/unload means are mounted to the appendable positions of the first IMMCVPS in lieu of two process chambers.

Figure 6:
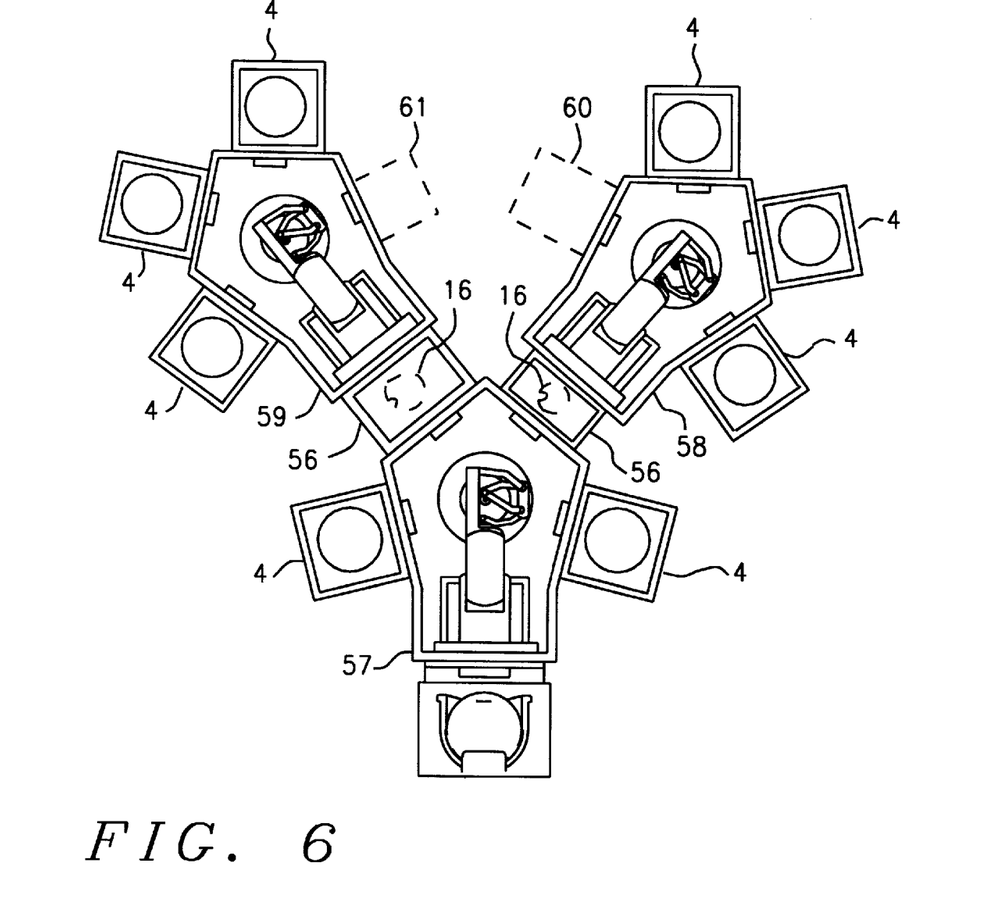
FIG. 6 is a simplified top plan view of the method to concatenate two or more of the prior art type single transfer integrated modular multiple chamber processing systems utilizing dual port orientors.

The present invention can be applied to this configuration in the manner illustrate in FIG. 6. By interposing one dual port pass through chamber 56, containing an orientor 16, between the first transfer chamber 57 and each of the two additional transfer chambers 58 and 59, it is possible to have aligned or oriented wafers served to all process chambers 4 with the error build up associated with only one transfer movement. In this configuration, any required alignment operation does not limit the maximum number of eight process chambers which could be appended. FIG. 6 further illustrates the effect of utilizing pass through chambers 56 to join transfer chambers 57, 58, and 59. Depending on the size of the pass through chamber 56 and the geometry of the other appended process chambers 60 and 61, it is possible to attain full use of the ten appendable positions for process chambers in this configuration as compare with the configuration of FIG. 2.

While the invention has been particularly shown and described with reference to the preferred embodiments thereof, it will be understood by those skilled in the art that various changes in form and details may be made without departing from the spirit and scope of the invention.

What is claimed is:

1. A method of processing a wafer made of semiconductor material requiring alignment within a concatenated integrated modular multiple chamber vacuum processing system having two wafer transfer means comprising the steps:

providing a first transfer chamber having a plurality of ports for attachment of a first plurality of vacuum chambers and having a first transfer means for transferring the wafer between any one of the first plurality of attached vacuum chambers, comprising a dual ported entrance chamber, a degas chamber, a cleaning chamber and a first dual ported pass through chamber;

providing a second transfer chamber having a plurality of ports for attachment of a second plurality of vacuum chambers and having a second transfer means for transferring the wafer between any one of the second plurality of attached vacuum chambers comprising at least one process chamber and the first dual ported pass through chamber;

providing an alignment means located within one of the second plurality of attached vacuum chambers; and sequentially entering the wafer into the first transfer chamber via the dual ported entrance chamber;

transferring the wafer by action of the first transfer means into the degas chamber wherein the wafer is degassed;

transferring the wafer by action of the first transfer means into the cleaning chamber wherein the wafer is cleaned;

transferring the wafer by action of the first transfer means into the dual ported pass though chamber;

transferring the wafer by action of the second transfer means from the dual ported pass through chamber to the alignment means chamber, wherein the wafer in aligned to a reference for a subsequent process;

transferring the wafer by action of the second transfer means from the alignment means chamber to the process chamber, wherein the wafer is processed.

2. The method according to claim 1 wherein the alignment means is an orientor responsive to a certain feature on the wafer, for orienting the wafer with respect to a position in the process chamber.

3. A method of processing a wafer made of semiconductor material requiring alignment within a concatenated integrated modular multiple chamber vacuum processing system having two wafer transfer means comprising the steps:

providing a first transfer chamber having a plurality of ports for attachment of a first plurality of vacuum chambers and having a first transfer means for transferring the wafer between any one of the first plurality of attached vacuum chambers, comprising a dual ported entrance chamber, a degas chamber, a cleaning chamber and a first dual ported pass through chamber;

providing a second transfer chamber having a plurality of ports for attachment of a second plurality of vacuum chambers and having a second transfer means for transferring the wafer between any one of the second plurality of attached vacuum chambers comprising at least one process chamber and the first dual ported pass through chamber;

providing an alignment means located within the first dual ported pass though chamber; and sequentially entering the wafer into the first transfer chamber via the dual ported entrance chamber;

transferring the wafer by action of the first transfer means into the degas chamber wherein the wafer is degassed;

transferring the wafer by action of the first transfer means into the cleaning chamber wherein the wafer is cleaned;

transferring the wafer by action of the first transfer means into the dual ported pass though chamber, wherein the wafer is aligned to a reference for a subsequent process;

transferring the wafer by action of the second transfer means from the dual ported pass through chamber tithe process chamber, wherein the wafer is processed.

4. The method according to claim 3 wherein the alignment means is an orientor responsive to a certain feature on the wafer, for orienting the wafer with respect to a position in the process chamber.

* * * * *